United States Patent
Ask et al.

(10) Patent No.: US 8,618,794 B2
(45) Date of Patent: Dec. 31, 2013

(54) DETECTING INDUCTIVE OBJECTS USING INPUTS OF INTEGRATED CIRCUIT DEVICE

(75) Inventors: Jonas Ask, Sandefjord (NO); Ivar Holand, Trondheim (NO)

(73) Assignee: Atmel Corporation, San Jose, CA (US)

( * ) Notice: Subject to any disclaimer, the term of this patent is extended or adjusted under 35 U.S.C. 154(b) by 520 days.

(21) Appl. No.: 12/848,071

(22) Filed: Jul. 30, 2010

(65) Prior Publication Data
US 2012/0025813 A1 Feb. 2, 2012

(51) Int. Cl.
*G01R 33/14* (2006.01)

(52) U.S. Cl.
USPC ...... 324/222; 324/207.12; 324/315; 324/403; 324/537; 324/765; 324/770

(58) Field of Classification Search
USPC ............ 324/222, 207.12, 315, 403, 537, 765, 324/770
See application file for complete search history.

(56) References Cited

U.S. PATENT DOCUMENTS

| | | | |
|---|---|---|---|
| 4,416,365 A * | 11/1983 | Heiman | 194/317 |
| 4,420,805 A * | 12/1983 | Yamaura et al. | 700/79 |
| 5,121,413 A * | 6/1992 | Voegtly et al. | 375/342 |
| 5,833,042 A * | 11/1998 | Baitch et al. | 194/317 |
| 6,215,365 B1 * | 4/2001 | Kurkovskiy | 331/65 |
| 6,339,322 B1 * | 1/2002 | Loreck et al. | 324/166 |
| 6,552,531 B1 * | 4/2003 | Fey et al. | 324/207.12 |
| 7,152,727 B2 * | 12/2006 | Waechter | 194/317 |
| 7,570,046 B2 * | 8/2009 | Keefover et al. | 324/207.12 |
| 2005/0283330 A1 * | 12/2005 | Laraia et al. | 702/104 |
| 2006/0190752 A1 * | 8/2006 | Lee | 713/323 |
| 2008/0036546 A1 * | 2/2008 | Taylor et al. | 331/66 |

FOREIGN PATENT DOCUMENTS

| | | | |
|---|---|---|---|
| JP | 07129273 A | * | 5/1995 |
| JP | 2004-064676 A | * | 2/2004 |
| JP | 2004-080167 A | * | 3/2004 |
| JP | 2009-152950 A | * | 7/2009 |

OTHER PUBLICATIONS

Christropher, RJ, Microprocessor-Controlled Recorder, IPCOM000066435D, Feb. 19, 2005, pp. 1-3.*

* cited by examiner

*Primary Examiner* — Arleen M Vazquez
*Assistant Examiner* — Giovanni Astacio-Oquendo
(74) *Attorney, Agent, or Firm* — Fish & Richardson P.C.

(57) ABSTRACT

A system for detecting inductive objects includes an inductive sensor circuit for detecting changes in an electromagnetic field ("EMF") environment and an integrated circuit ("IC") device. The inductive sensor circuit generates an oscillating analog waveform with an envelope that indicates changes in the EMF environment. The oscillating waveform is coupled to the digital input pin of the IC. A digital interface circuit in the IC is coupled to the digital input pin and is configured for detecting if the oscillating waveform exceeds high and low threshold voltage levels. The detecting results in a digital pulse which represents changes in the EMF environment. In another implementation, a timer input capture pin can be used to detect the waveform envelope decay by storing the time when the waveform crosses a threshold value during a time period. A reduced capture time after the time period expires indicates a change in the EMF environment.

14 Claims, 5 Drawing Sheets

DETECTING INDUCTIVE OBJECTS USING INPUTS OF INTEGRATED CIRCUIT DEVICE

TECHNICAL FIELD

This subject matter is generally related to electronics, and more particularly to detecting inductive objects in proximity to a sensor coil.

BACKGROUND

In some applications it is desirable to measure changes in an electromagnetic field ("EMF") environment surrounding an inductive coil. These measured changes can be used in a sensor to detect the presence of magnetic materials. A conventional sensor for measuring changes in an EMF environment is an inductor-capacitor ("LC") oscillator circuit. The LC circuit can be charged by running current through it, and then letting the LC circuit oscillate freely. The resulting oscillation of energy creates an oscillating waveform, which can be observed by an application. The relative dampening of this waveform reflects changes in the perceived inductance of the coil in the LC circuit. When a metallic object is close to the coil, the LC oscillator dissipates its energy faster because of the inductive coupling the coil forms with the metallic object. The magnetic coupling results in more rapid decay of the waveform envelope. The decay or fall off of the waveform envelope can be quantified to produce an inductive sensor signal.

A conventional approach for measuring changes in an EMF environment uses an Analog Comparator with a tuneable reference level often generated by a digital-to-analog converter circuit ("DAC"). The analog comparator can be used to compare the waveform to the DAC-generated reference, and a mechanism then counts the number of times the oscillating waveform and reference voltage intersect. This count can be used as the inductive sensor's signal.

Although the conventional analog approach works, using analog components can result in an expensive circuit design that may not be easily adapted to other applications.

SUMMARY

A system for detecting inductive objects includes an inductive sensor circuit for detecting changes in an EMF environment and an integrated circuit ("IC") device. The inductive sensor circuit generates an oscillating analog waveform with an envelope that indicates changes in the EMF environment. The oscillating waveform is coupled to the digital input pin of the IC device. A digital interface circuit in the IC device is coupled to the digital input pin and is configured for detecting if the oscillating waveform exceeds first and second threshold voltage levels. The detecting results in a digital pulse which represents the inductive sensor circuit signal. Using the digital pulse, an application can measure changes in the EMF environment.

In another implementation, the analog waveform generated by the inductive sensor circuit can be input to a timer input capture pin of the IC device. A timer module in the IC device can be programmed to store the associated timer value in a register of the IC device each time the input toggles (e.g., a zero crossing event). The timer module can be programmed to give a wake up signal after a predetermined time, and then have the device read the new sensor value from the timer input capture register. The predetermined time can be set long enough for the oscillating waveform envelope to fall within a hysteresis band of the timer input capture pin. If the envelope of the waveform is decaying more rapidly (indicating a change in the EMF environment), the last time capture event will trigger earlier due to a smaller envelope amplitude in the oscillating waveform. The earlier capture time indicates a change in the EMF environment, and if this change is above a given threshold it constitutes a sensor detect state.

In some implementations, a system for detecting changes in an EMF environment includes an inductive sensor circuit and an integrated circuit device. The inductive sensor circuit is configured to generate an oscillating analog waveform having an envelope that decays in response to a change in an electromagnetic field environment. The integrated circuit device is coupled to the inductive sensor circuit through a digital input pin. The integrated circuit device includes digital interface circuitry coupled to the digital input pin. The digital interface circuitry is configured to compare the oscillating waveform with first and second threshold levels, where the second threshold level is less than the first threshold level, and for outputting a digital pulse based on the comparing. A processor is coupled to the digital interface circuitry. The processor is configured to receive the digital pulse and to determine a change in the EMF environment based on the digital pulse.

In some implementations, a system for detecting changes in an electromagnetic field environment field environment includes an inductive sensor circuit and an integrated circuit device. The inductive sensor circuit is configured to generate an oscillating analog waveform having an envelope that decays in response to a change in an electromagnetic field environment. The integrated circuit device is coupled to the inductive sensor circuit through a timer input capture pin. The integrated circuit device includes interface circuitry coupled to the timer input capture pin, a timer and a register. The interface circuitry is configured to store a current time value generated by the timer each time the waveform crosses a threshold. A processor is coupled to the interface circuitry and configured to retrieve a last stored time value after a time period expires, and to determine a change in the EMF environment based on the last stored time value.

In some implementations, a method of detecting changes in an electromagnetic field environment field ("EMF") environment includes: generating an oscillating analog waveform having an envelope that decays in response to a change in an electromagnetic field environment; coupling the waveform to a digital input pin of an integrated circuit device; processing the waveform to provide a digital pulse, the processing including using a digital interface circuit associated with the digital input pin to compare the oscillating waveform with first and second threshold levels, where the second threshold level is less than the first threshold level; and determining a change in the EMF environment based on the digital pulse.

In some implementations, a method of detecting changes in an electromagnetic field environment field ("EMF") environment includes: generating an oscillating analog waveform having an envelope that decays in response to a change in an electromagnetic field environment; coupling the waveform to a timer input capture pin of an integrated circuit device; starting a timer, where the timer is to run for a time period; storing a current time value of the timer each time the waveform crosses a threshold value; determining that the timer has exceed the time period; and determining a change in the EMF environment based on a last stored time value.

Using the digital input pin and existing digital interface circuitry of an IC to detect changes in an EMF environment can result in a simple inexpensive circuit design that can be easily adapted to other applications. Using the timer input capture pin provides an additional advantage of allowing the processor of the IC to enter sleep mode while running the timer.

DETAILED DESCRIPTION

System Overview

Figure 1A:
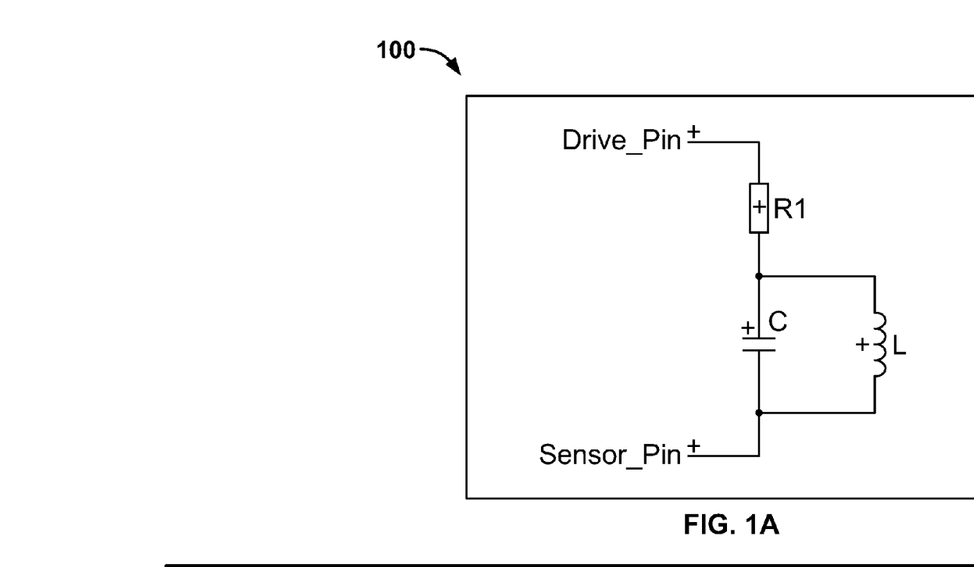
FIG. 1A is a schematic diagram of an inductive sensor circuit.

FIG. 1A is a schematic diagram of inductive sensor circuit 100. In some implementations, Sensor circuit 100 is an LC circuit including an inductor L, capacitor C and resistor R1. Sensor circuit 100 includes a drive input pin (DRIVE_PIN) and sensor output pin (SENSOR_PIN). The values of L, C and R1 can be selected to cause the sensor circuit 100 to oscillate when driven by a drive current applied to DRIVE_PIN. The resulting oscillation of energy between the L and C creates a waveform which can be observed by an application. When the inductor or "coil" L is placed near a magnetic material the perceived inductance of the sensor circuit 100 changes, resulting in a dissipation of energy. The dissipation of energy is reflected in a decay of the envelope of the waveform over time. A more rapid decay in the envelope of the oscillating waveform indicates a change in the EMF environment of the coil.

Figure 1B:
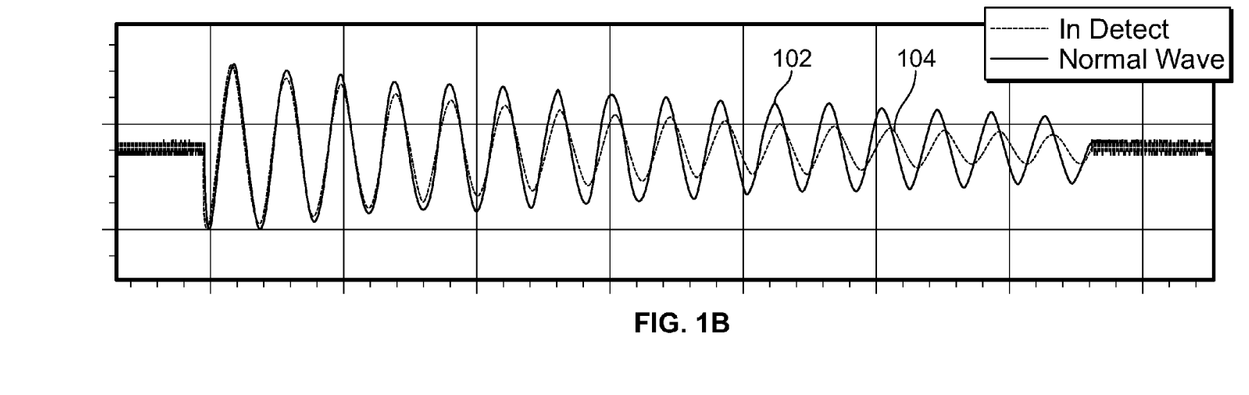
FIG. 1B illustrates an oscillating waveform generated by the inductive sensor circuit of FIG. 1.

FIG. 1B illustrates an oscillating waveform generated by the inductive sensor circuit 100 of FIG. 1. A first waveform 102 occurs when the coil is not in proximity to a metallic object. A second waveform 104 occurs when the coil is in proximity of a metallic object. The relative dampening of the waveforms 102, 104 reflects the changes in the perceived inductance, L, of the coil. When a metallic object is close to the coil, the sensor circuit 100 dissipates its energy faster because of the inductive coupling the coil forms with the metallic object. This coupling results in more rapid decay of the waveform envelope, as shown in FIG. 1B.

Figure 1C:
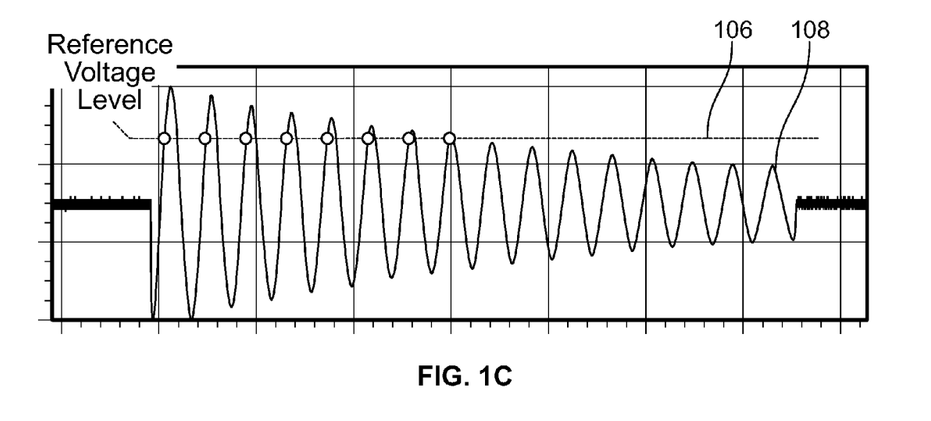
FIG. 1C illustrates a conventional method of detecting a change in the EMF environment based on the waveform using analog components.

FIG. 1C illustrates a conventional method of detecting a change in the EMF environment based on an oscillating waveform 108 using analog components. In this example, a DAC is used to create a reference voltage 106 that intersects the oscillating waveform 108 at some predetermined level, as shown in FIG. 1C. Analog Comparator ("AC") can be used to compare the waveform 108 to the DAC-generated reference voltage 106, and a mechanism (e.g., a counter), then counts the number of times the oscillating waveform 108 and DAC-generated reference voltage 106 intersect. This count then becomes the sensor output signal that can be used by an application to detect changes in an EMF environment.

While this conventional approach works for some applications, the use of analog components, such as a DAC and analog comparator, may be unsuitable for some applications due to the higher cost and complexity of the analog components. An alternative all digital approach is disclosed in reference to FIGS. 2-6, which overcomes the disadvantages of the conventional method.

Figure 2:
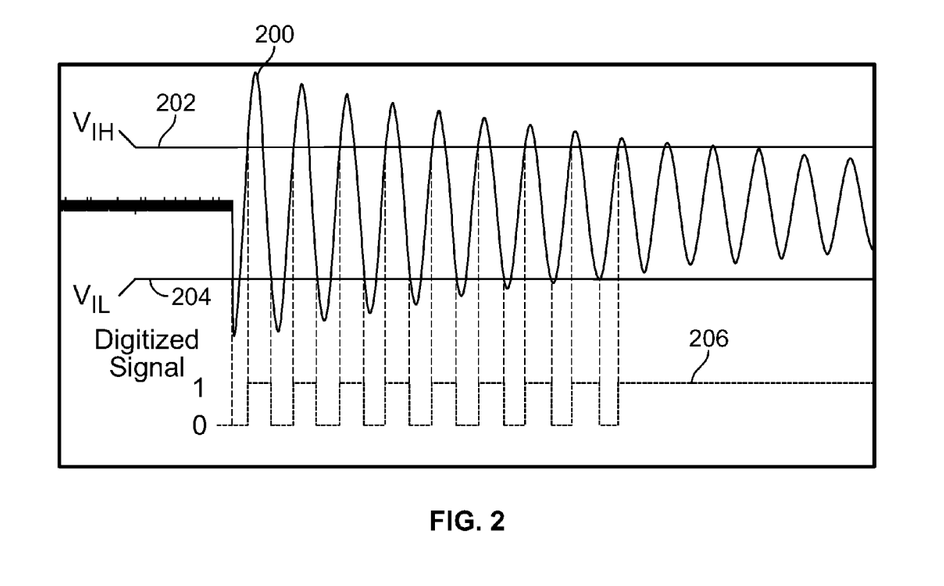
FIG. 2 illustrates generating a digital pulse from an oscillating waveform using the digital input of an IC device.

FIG. 2 illustrates generating a digital pulse 206 from an oscillating waveform 200 using the digital input of an IC device. Instead of using analog components, the implicit voltage comparison commonly provided by a digital input pin of a commercially available IC device (e.g., microcontroller) can be used to generate the digital pulse 206 that can be used by an application to detect changes in an EMF environment. Typically, a digital input pin will be coupled to a digital interface circuit that is configured to receive the digital input signal 200. Because the digital input signal 200 may have been subjected to noise or hysteresis, the digital interface circuit compares the digital input signal 200 with threshold voltage levels 202, 204 to register the digital input signal 200 as logical high or logical low. For example, the digital input signal 200 can register as a logic "high" or "one" when the voltage of the digital input signal 200 on the digital input pin is higher than a first threshold level 202 (e.g., 3.6 Volts), also denoted as $V_{IH}$ in FIG. 2. Because of hysteresis, the voltage level on the digital input pin has to drop below a second threshold level 204 (e.g., 0.9 Volts), also denoted as $V_{IL}$ in FIG. 2, before it registers as a digital low or "zero."

As described above, the operation of the digital interface can be leveraged to create a simple, yet effective, voltage comparator. As long as the waveform envelope from the second circuit 100 is wide enough to encompass both $V_{IH}$ and $V_{IL}$, connecting the waveform to a digital input pin of the IC device will convert the waveform into the digital pulse 206. The number of times the digital pulse 206 toggles from high to low or back again can be counted (e.g., by a software counter implemented in the IC device), thus creating the desired inductive sensor signal without using any analog components or adding additional digital components. The number of toggles will depend on the amplitude of the envelope, a faster dissipating envelope will mean that there are fewer toggles on the digital I/O pin. In some implementations, the values of $V_{IH}$ and $V_{IL}$ may not be calibrated, and can vary between IC devices. The lack of calibration is not a problem since it is the relative changes to the waveform that are used to determine changes in the inductive sensor signal.

Exemplary IC Device

Figure 3:
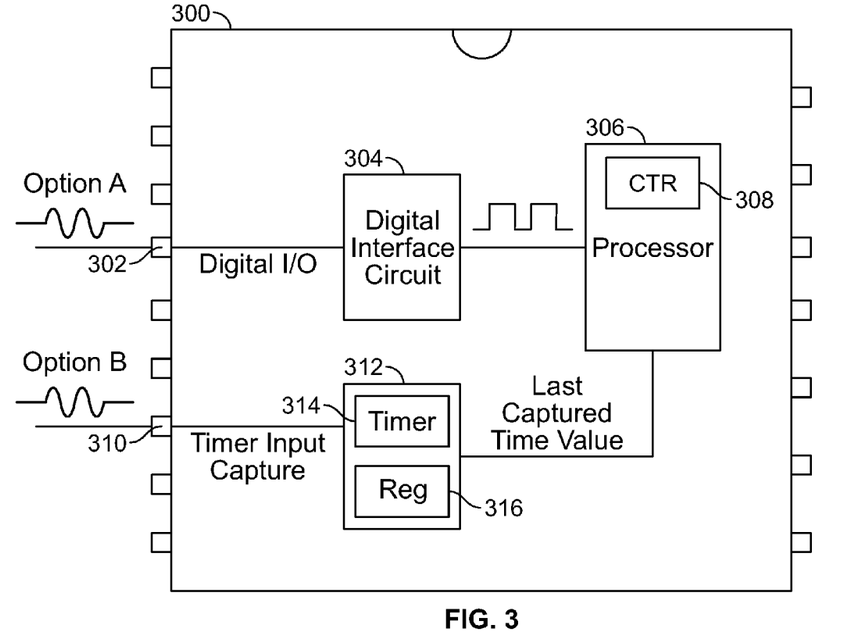
FIG. 3 is a block diagram of an exemplary IC device with digital input and timer input capture pins, and corresponding circuitry for detecting changes in EMF environments from an oscillating waveform.

FIG. 3 is a block diagram of an exemplary IC device 300 with digital input and timer input capture pins, and corresponding circuitry for detecting changes in EMF environments from an oscillating waveform. FIG. 3 illustrates two possible options for using input pins of an IC device for detecting changes in EMF environments from an oscillating waveform. A first option A uses a digital input pin and a second option B uses a timer input capture pin. In some implementations, both options A and B can be used where one option can be used to confirm the accuracy of the other option or for other reasons (e.g., option B is used only in low power sleep mode).

In some implementations, IC device 300 can include digital input pin 302, digital interface circuit 304 and processor 306. Processor 306 can include digital counter 308. Digital counter 308 can be located elsewhere in IC device 300, external to IC device 300 or implemented in software. IC device 300 can be any IC device with a digital input pin that performs a threshold comparison as described in reference to FIG. 2 (e.g., a microcontroller).

In operation, an oscillating analog waveform is coupled to digital input pin 302. The digital interface circuit 304 compares the waveform with first and second threshold levels and generates a digital pulse based on the comparing. The digital pulse can then be processed by processor 308, which uses counter 306 to count the number of times the digital pulse toggles from high to low or back again. The count of counter 306 can be used to determine whether the coil of sensor circuit 100 is in proximity to a metallic object.

In some implementations, IC device 300 includes timer input capture pin 310, interface circuit 312 and processor 306. Interface circuit 312 can include timer module 314 and register 316. Timer module 314 and register 316 can also be included in processor 306 or part of another circuit in IC device 300. Timer module 314 and register 316 can also be located outside of IC device 300.

In operation, an oscillating analog waveform is coupled to time input capture pin 310. Timer 314 can be started and allowed to run for a defined (e.g., programmed) time period. For example, a time period can be programmed that is long enough for the oscillating waveform envelope to fall within a hysteresis band of the digital input pin. Processor 306 can be programmed to store an associated timer value in register 316 each time the oscillating waveform crosses a threshold level. For example, the current time value of timer 314 can be stored in register 316 each time a zero crossing occurs (waveform goes from positive to negative or drops below zero voltage) during the defined time period. Upon expiration of the defined time period, the last stored time value can be compared to a reference time value to determine if the coil of sensor circuit 100 is in proximity to a metallic object. The reference time value can be determined empirically by running the system without a metallic object, and storing the resulting last time value as a reference value. For example, if the envelope has decayed due to a change in the perceived inductance of sensor circuit 100, the last time value captured and stored in register 316 will be less (earlier) than the reference time value. Using the timer input capture pin 310 allows processor 306 to enter sleep mode while timer 314 is running.

Exemplary Digital Interface Circuit

Figure 4:
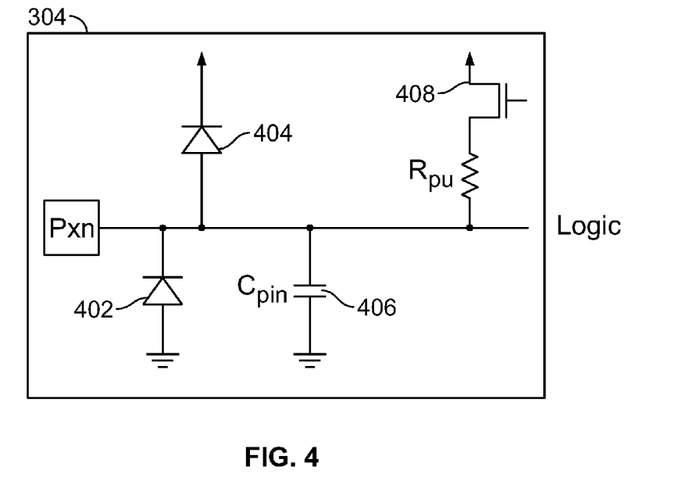
FIG. 4 is a schematic diagram of an exemplary digital interface circuit for generating a digital pulse from an oscillating waveform.

FIG. 4 is a simplified schematic diagram of an exemplary digital interface circuit 304 for generating a digital pulse from an oscillating waveform. In some implementations a digital interface circuit 304 can include diodes 402, 404, capacitance 406 and transistor 408. When an oscillating waveform is applied to the input of circuit 304, the output of circuit 304 is a sequence of digital pulses, as illustrated in FIG. 2. Other circuit configurations with more or fewer components are also possible.

Figure 5:
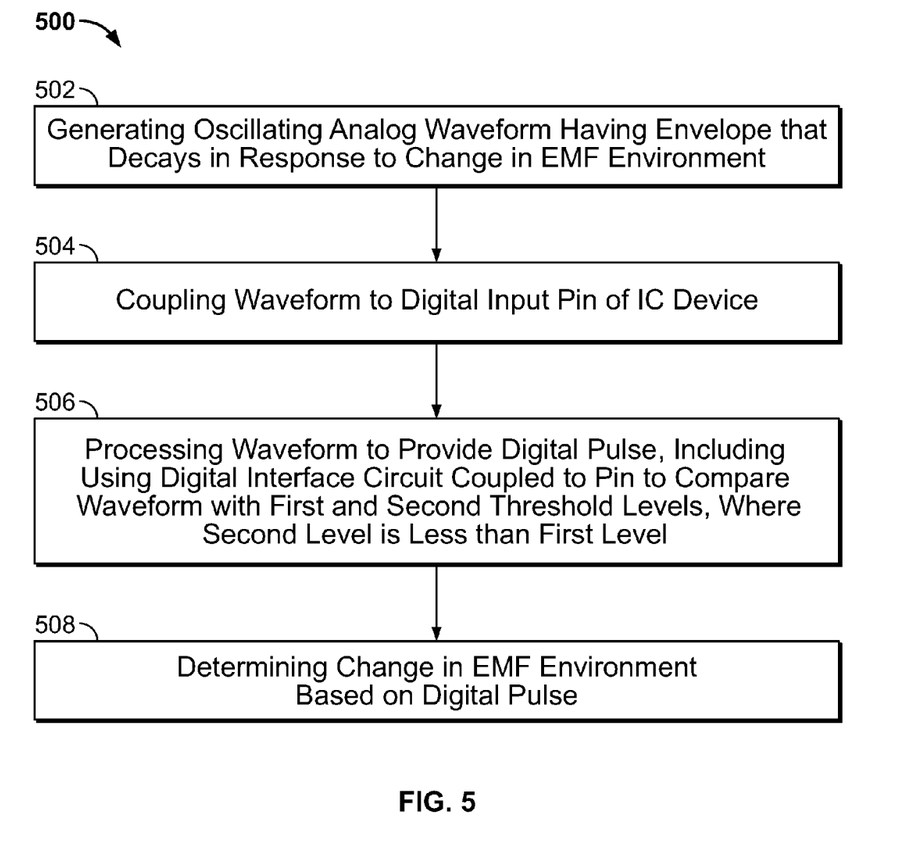
FIG. 5 is a flow diagram of an exemplary process for detecting changes in an EMF environment using a digital input pin.

FIG. 5 is a flow diagram of an exemplary process 500 for detecting changes in an EMF environment using a digital input pin. Process 500 can be performed by processor 306 in FIG. 3. In some implementations, process 500 begins by generating an oscillating analog waveform having an envelope that decays in response to a change in an EMF environment (502). In some implementations, sensor circuit 100 can generate this waveform. Next the waveform is coupled to a digital input pin of an IC device (504). For example, the SENSOR_PIN can be electrically connected with a circuitry trace or wire to digital input pin 302 of IC device 300. Digital input pin 302 can be coupled to a digital interface circuit that processes the waveform to provide a digital pulse (506). For example, the waveform can be compared with first and second threshold levels, where the second level is less than the first level. The existing digital interface circuit often used with a digital input of an IC device can be leveraged to perform the comparing and to set the threshold levels, thus avoiding the need to use analog components or add digital components. A change in the EMF environment can be determined based on the digital pulses (508). For example, a counter can count the number of times the digital pulse toggles from high to low and back again to determine if the coil of the sensor is in proximity to a metallic objects. When a defined time period for counting expires, a signal can be sent to the processor. In response to the signal, the processor can retrieve the number of pulses, and report it to the main application (e.g., software application) for processing. In the case of a software counter this process becomes trivial by not using signals or interrupts.

Figure 6:
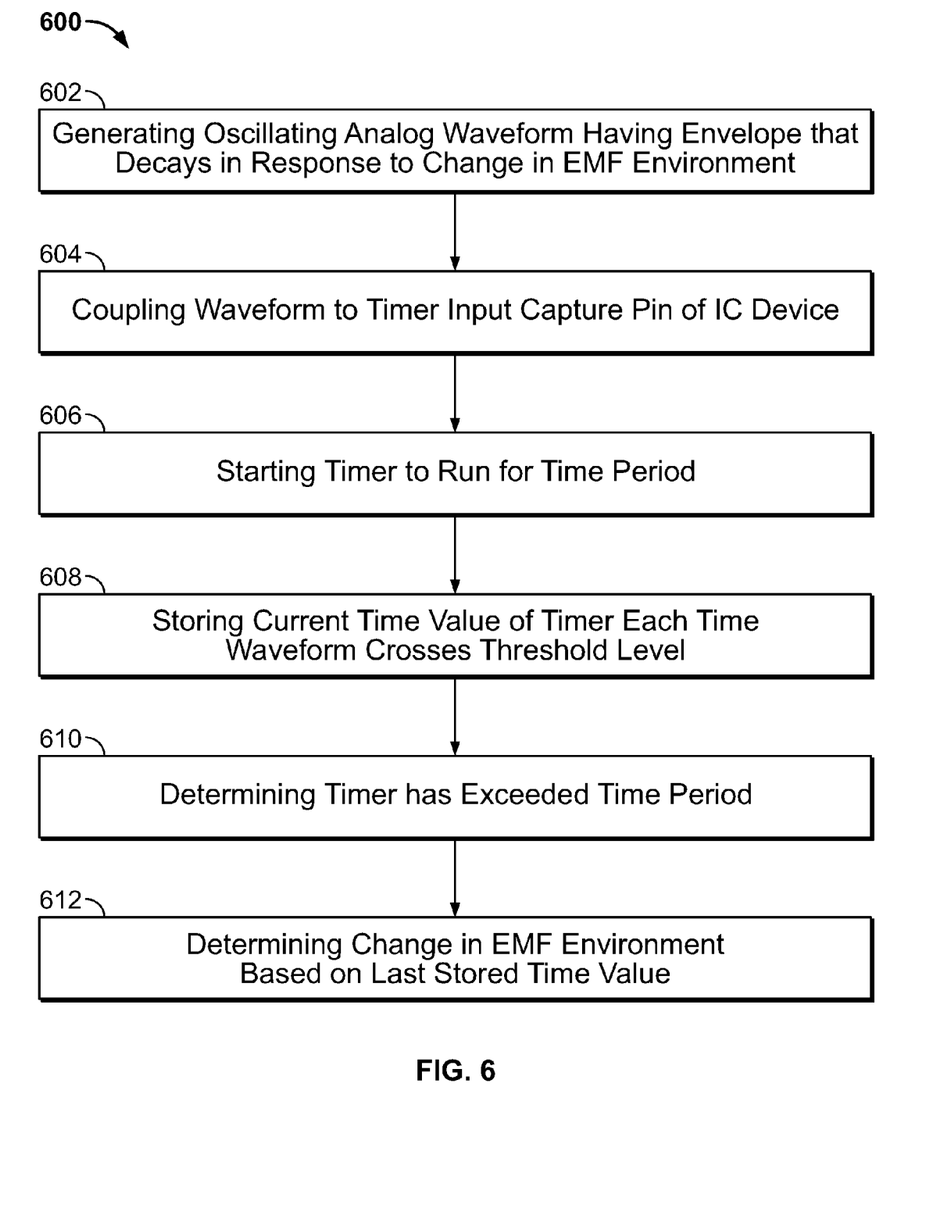
FIG. 6 is a flow diagram of an exemplary process for detecting changes in an EMF environment using a timer input capture pin.

FIG. 6 is a flow diagram of an exemplary process 600 for detecting changes in an EMF environment using a timer input capture pin. Process 600 can be performed by processor 306 in FIG. 3. In some implementations, process 600 begins by generating an oscillating analog waveform having an envelope that decays in response to a change in an EMF environment (602). In some implementations, sensor circuit 100 can generate this waveform. Next the waveform is coupled to a timer input capture pin of an IC device (604). For example, the SENSOR_PIN of sensor circuit 100 can be electrically connected with a circuitry trace or wire to timer input capture pin 310 of IC device 300. A timer is started and allowed to run for a time period (606). The time period can be long enough for the envelope of the oscillating waveform to fall within a hysteresis band of the digital input pin. The current time value of the timer is stored each time the waveform crosses a threshold level or toggles (608). For example, the time value can be stored in register 316 in IC device 300.

Expiration of the time period is determined (610). For example, processor 306 in the IC device 300 may receive a signal or interrupt from timer 312 when the time period has expired. Processor 300 can also reset timer 312 for a next time period. After the time period expires, a change in the EMF environment can be determined based on the last stored time value (612). For example, processor 300 can receive in an interrupt form timer 312, and in response, processor 312 can retrieve the last time value stored register 316. If the last stored time value is less than a reference time value (e.g., empirically determined time value), then an application can be alerted that a change to the EMF environment.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A system for detecting changes in an electromagnetic field ("EMF") environment, comprising:
    an inductive sensor circuit configured to generate an oscillating analog waveform having an envelope that decays in response to a change in an electromagnetic field environment;
    an integrated circuit device coupled to the inductive sensor circuit through a digital input pin, the integrated circuit device including digital interface circuitry coupled to the digital input pin, the digital interface circuitry configured to generate a digital pulse from the oscillating analog waveform by comparing the oscillating analog waveform with first and second threshold voltage levels, where the second threshold level is less than the first threshold level, and for outputting the digital pulse; and
    a processor coupled to the digital interface circuitry, the processor configured to receive the digital pulse and to determine a change in the EMF environment based on the digital pulse.

2. The system of claim 1, where the inductive sensor circuit is an inductor-capacitor ("LC") circuit that freely oscillates in response to a drive signal.

3. The system of claim 1, where comparing the oscillating analog waveform to first and second threshold levels includes comparing a voltage level on the digital input pin with a first threshold voltage level during a first half cycle of the waveform, and comparing the voltage level on the digital input pin with a second threshold voltage level during a second half cycle of the waveform.

4. The system of claim 1, where the processor determines a change in the EMF environment by counting a number of times the digital pulse exceeds the first and second threshold levels over a time period.

5. A system for detecting changes in an electromagnetic field environment field ("EMF") environment, comprising:
    an inductive sensor circuit configured to generate an oscillating analog waveform having an envelope that decays in response to a change in an electromagnetic field environment;
    an integrated circuit device coupled to the inductive sensor circuit through a timer input capture pin of the integrated circuit device, the integrated circuit device including interface circuitry coupled to the timer input capture pin, a timer and a register, the interface circuitry configured to store a current time value generated by the timer each time the waveform crosses a predetermined threshold; and
    a processor coupled to the interface circuitry and configured to retrieve a last stored time value after a time period expires, and to determine a change in the EMF environment based on the last stored time value.

6. The system of claim 5, where the inductive sensor circuit is an inductor-capacitor ("LC") circuit that freely oscillates in response to a drive signal.

7. The system of claim 5, where the processor is operating in sleep mode while running the timer.

8. The system of claim 5, where the processor determines a change in the EMF environment based on the last stored time value if the last stored time value is less than a threshold time value.

9. A method of detecting changes in an electromagnetic field environment field ("EMF") environment, comprising:
    generating an oscillating analog waveform having an envelope that decays in response to a change in an electromagnetic field environment;
    coupling the oscillating analog waveform to a digital input pin of an integrated circuit device;
    processing the oscillating analog waveform to generate a digital pulse from the oscillating analog waveform, the processing including using a digital interface circuit included in the integrated circuit device and coupled to the digital input pin to compare the oscillating analog waveform with first and second threshold levels, where the second threshold level is less than the first threshold level; and
    determining a change in the EMF environment based on the digital pulse.

10. The method of claim 9, where comparing the oscillating analog waveform to first and second threshold levels further comprises comparing a voltage level on the digital input pin with a first threshold voltage level during a first half cycle of the waveform, and comparing the voltage level on the digital input pin with a second threshold voltage level during a second half cycle of the waveform.

11. The method of claim 9, where the processor determines a change in the EMF environment further comprises counting a number of times the digital pulse exceeds the first and second threshold levels over a time period.

12. A method of detecting changes in an electromagnetic field environment field ("EMF") environment, comprising:
    generating an oscillating analog waveform having an envelope that decays in response to a change in an electromagnetic field environment;
    coupling the oscillating analog waveform to a timer input capture pin of an integrated circuit device;
    starting a timer, where the timer is to run for a time period;
    storing a current time value of the timer each time the waveform crosses a threshold level;
    determining that the timer has exceeded the time period; and
    determining a change in the EMF environment based on a last stored time value.

13. The method of claim 12, further comprising running the timer while a processor of the integrated circuit device is in sleep mode.

14. The system of claim 12, where the processor determines a change in the EMF environment based on the last stored time value if the last stored time value is less than a threshold time value.

* * * * *

UNITED STATES PATENT AND TRADEMARK OFFICE
CERTIFICATE OF CORRECTION

PATENT NO.         : 8,618,794 B2                                          Page 1 of 1
APPLICATION NO.    : 12/848071
DATED              : December 31, 2013
INVENTOR(S)        : Jonas Ask et al.

It is certified that error appears in the above-identified patent and that said Letters Patent is hereby corrected as shown below:

In the Specification

1.) Column 2, Line 26: after "electromagnetic field" delete "environment field".

2.) Column 2, Line 42: after "electromagnetic field" delete "environment field".

3.) Column 2, Line 54: after "electromagnetic field" delete "environment field".

In the Claims

4.) Column 7, Claim 5, Line 39: after "field" delete "environment field".

5.) Column 8, Claim 9, Line 8: after "field" delete "environment field".

6.) Column 8, Claim 12, Line 38: after "field" delete "environment field".

7.) Column 8, Claim 14, Line 54: delete "system" and insert --method--.

Signed and Sealed this
Second Day of September, 2014

Michelle K. Lee
*Deputy Director of the United States Patent and Trademark Office*